(12) United States Patent
Cho

(10) Patent No.: US 8,309,412 B2
(45) Date of Patent: Nov. 13, 2012

(54) METHOD FOR FORMING SEMICONDUCTOR DEVICE WITH BURIED GATE STRUCTURE

(75) Inventor: Young Man Cho, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 199 days.

(21) Appl. No.: 12/842,599

(22) Filed: Jul. 23, 2010

(65) Prior Publication Data

US 2011/0151632 A1      Jun. 23, 2011

(30) Foreign Application Priority Data

Dec. 21, 2009   (KR) ........................ 10-2009-0127901

(51) Int. Cl.
*H01L 21/8242*   (2006.01)

(52) U.S. Cl. ........ 438/239; 438/250; 438/253; 438/256; 257/68; 257/905; 257/906; 257/908; 257/E21.646

(58) Field of Classification Search ................... 438/239, 438/250, 253, 256; 257/68, 905, 906, 908, 257/E21.646
See application file for complete search history.

(56) References Cited

FOREIGN PATENT DOCUMENTS
KR       1020090100853 A       9/2009

*Primary Examiner* — Thanh V Pham

(57) ABSTRACT

A method for forming a semiconductor device includes: etching a hard mask layer and a conductive layer formed on a semiconductor substrate, a lower structure being formed on the semiconductor substrate; forming a sacrificial insulating layer at upper parts of the etched hard mask layer and the etched conductive layer of a peripheral circuit region; forming an isolation insulating layer at an upper part of an isolation insulating layer of a cell region; forming spacers at sidewalls of the etched hard mask layer, the etched conductive layer, and the isolation insulating layer of the cell region, respectively; forming storage electrode contact plugs at both sides of each of the spacers, respectively; and removing the sacrificial insulating layer to expose the semiconductor substrate of the peripheral circuit region, and etching the lower structure to expose the semiconductor substrate of the peripheral circuit region.

20 Claims, 17 Drawing Sheets

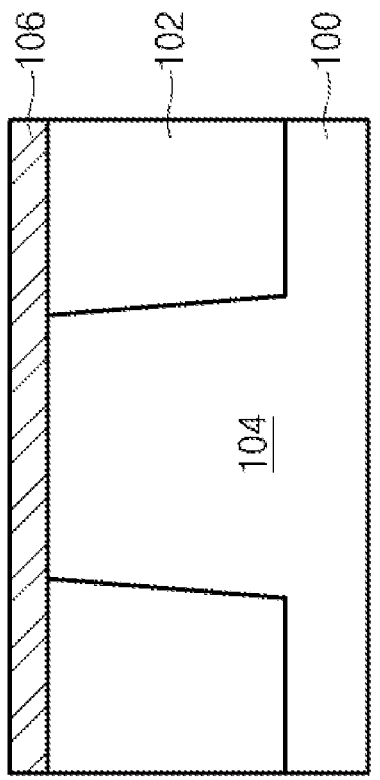
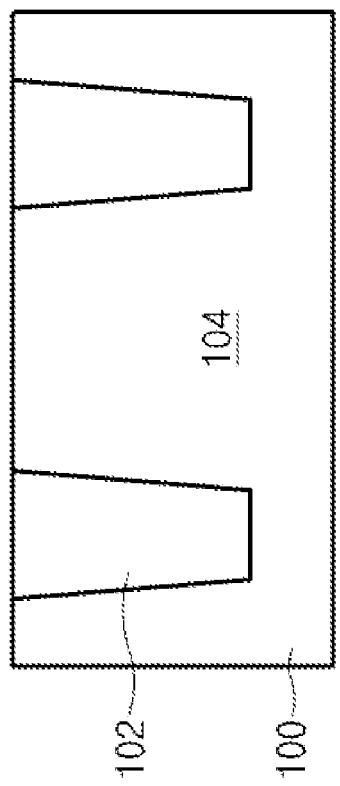
Fig.1B

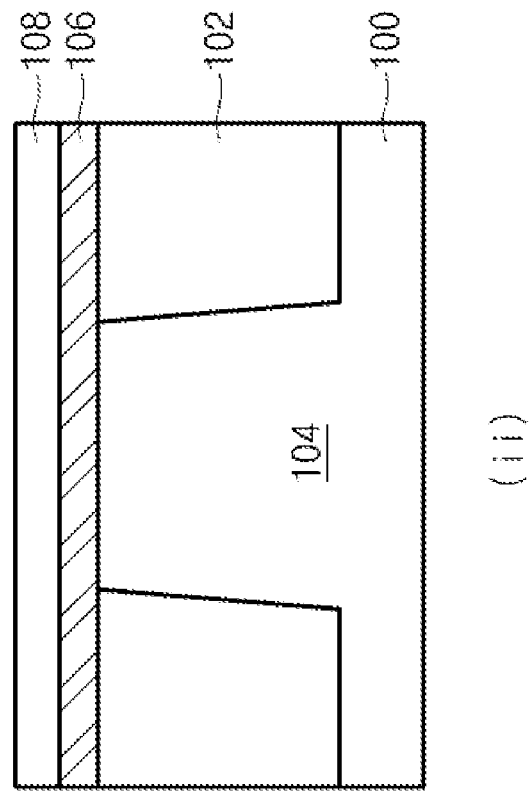
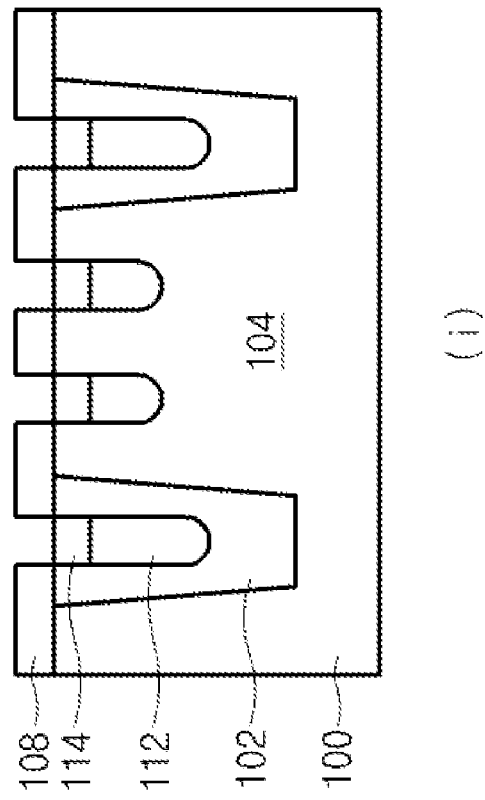
Fig.1D

METHOD FOR FORMING SEMICONDUCTOR DEVICE WITH BURIED GATE STRUCTURE

CROSS-REFERENCES TO RELATED APPLICATIONS

The present application claims priority to Korean patent application number 10-2009-0127901, filed on Dec. 21, 2009, which is incorporated by reference in its entirety.

BACKGROUND OF THE INVENTION

The present invention relates to a method for forming a semiconductor device, more particularly, to a method for forming a semiconductor device including a buried gate structure.

Among semiconductor memory devices, a dynamic random access memory (DRAM) is constructed of a plurality of unit cells, each including a capacitor and a transistor. The capacitor is used to temporarily store data. The transistor is used to move data between a bit line and the capacitor according to a control signal using the characteristics of a semiconductor to change an electric conductivity according to an environment. The transistor is composed of three regions including a gate, a source, and a drain. Charge transfer occurs between the source and the drain according to a control signal input to the gate. The charge transfer between the source and the drain is achieved through a channel region using the characteristics of the semiconductor.

A typical transistor is manufactured on a semiconductor substrate. After a gate is formed on the semiconductor substrate, impurities are doped on both sides of the gate to form a source and a drain. In this case, a channel region of a transistor is formed between the source and the drain under the gate. The transistor having such a horizontal channel region occupies a predetermined area of a semiconductor substrate. In the case of a complicated semiconductor memory device, it becomes difficult to reduce a total area due to a plurality of transistors included therein.

When the total area of a semiconductor memory device is reduced, the number of semiconductor memory devices per wafer may be increased to enhance productivity. Various methods have been proposed to reduce the total area of the semiconductor memory device. Among them, one method uses a recess gate in which a recess is formed in a substrate and a gate is formed in the recess to form a channel region along a curve of the recess, instead of a conventional planar gate with a horizontal channel region. In addition to the recess gate, research into a buried gate has been made. In this case, an entire part of the gate is buried in the recess to form the buried gate.

Meanwhile, in order to form a semiconductor device with a buried gate according to the related art, a bit line of a cell region and a gate of a peripheral circuit region are simultaneously patterned.

In summary, after a bit line of a cell region and a gate of a peripheral circuit region are simultaneously patterned, an interlayer dielectric layer is deposited on the entire upper parts of the cell region and the peripheral circuit region to define a storage electrode contact. At this time, Boron Phosphorous Silicate Glass (BPSG) is used as an interlayer dielectric layer material to fill the space between the bit lines of the cell region. Here, a spacer is thickly formed over an upper part of the gate of the peripheral circuit region to prevent boron of the BPSG from permeating into a semiconductor substrate of the peripheral circuit region.

However, in this procedure, the spacer at an upper part and a sidewall of a bit line in the cell region is also thickly formed as well. This reduces a contact area between an active region and a storage electrode contact, and thus increases resistance. Furthermore, when the BPSG is applied as the interlay dielectric layer, a thermal process should be essentially performed. This causes a problem where a gate operation current of the peripheral circuit region is decreased and a leakage current is increased. Moreover, when a storage electrode is formed in the cell region, a hard mask layer (over the bit line in the cell region) is thickly formed as an etch stopping layer. In the same manner, a gate formed in the peripheral circuit region also turns out to have a thick hard mask. A gate pattern and a storage electrode pattern with a high aspect ratio makes it hard to properly adjust a tiling angle during an implant process.

BRIEF SUMMARY OF THE INVENTION

Embodiments of the present invention are directed to a method for forming a semiconductor device with a buried gate that may prevent degradation of the semiconductor device occurring when subsequent processes are simultaneously applied to a cell region and a peripheral circuit region by simultaneously patterning a bit line of the cell region and a gate of the peripheral circuit region.

According to an embodiment of the present invention, a method for forming a semiconductor device includes: etching a hard mask layer and a conductive layer formed on a semiconductor substrate, a lower structure being formed on the semiconductor substrate; forming a sacrificial insulating layer over the etched hard mask layer and the etched conductive layer of a peripheral circuit region; forming an isolation insulating layer on a device isolation region of a cell region; forming spacers at sidewalls of the etched hard mask layer, the etched conductive layer, and the isolation insulating layer of the cell region, respectively; forming storage electrode contact plugs at both sides of each of the spacers, respectively; and etching the lower structure to expose the semiconductor substrate of the peripheral circuit region to form a gate.

In accordance with an embodiment of the present invention, before etching a hard mask layer and a conductive layer, a method for forming a semiconductor device further includes forming a buried gate in the semiconductor substrate of the cell region.

The lower structure includes a bit line contact plug formed at a lower part of the conductive layer of the cell region; and a poly-silicon layer formed at the peripheral circuit region.

In accordance with an embodiment of the present invention, after etching a hard mask layer and a conductive layer, a method for forming a semiconductor device further includes coating a capping insulating layer on the etched hard mask layer and the etched conductive layer.

Etching the lower structure of the peripheral circuit region includes etching the lower structure by using the capping insulating layer formed on the etched hard mask layer and the etched conductive layer of the peripheral circuit region.

Forming a sacrificial insulating layer at the peripheral circuit region includes forming the sacrificial insulating layer at an upper entire part; and removing the sacrificial insulating layer of the cell region using a cell open mask. A sacrificial insulating layer includes a plasma enhanced tetra ethyl ortho silicate (PETEOS) layer or a high density plasma (HDP) layer. Forming a sacrificial insulating layer is formed at 300° C. to 500° C. Forming an isolation insulating layer on the device isolation region of a cell region includes forming an interlayer dielectric layer over the cell region; removing the interlayer dielectric layer to expose the upper part of the device isolation region; forming an isolation insulating layer on the interlayer dielectric layer and a region in which the interlayer dielectric layer is removed; removing the isolation insulating layer formed on the interlayer dielectric layer; and removing the interlayer dielectric layer remaining at a sidewall sides of the isolation insulating layer.

The isolation insulating layer comprises a nitride layer. Removing the isolation insulating layer is performed by a dry etch process. Removing the interlayer dielectric layer is performed by a wet etch process.

In accordance with an embodiment of the present invention, after forming the spacers, a method for forming a semiconductor device further includes etching the lower structure of the cell region to form a bit line by using the spacers as an etch mask.

Forming storage electrode contact plugs at both sides of each of the spacers, respectively, includes forming a conductive layer for a storage electrode contact plug over the cell region and the peripheral circuit region; and performing a planarization etch process to expose the upper part of the etched hard mask layer of the cell region and the isolating insulating layer of the peripheral region and removing the sacrificial insulating layer of the peripheral circuit region. Removing the sacrificial insulating layer of the peripheral region is performed by using a different etching selectivity of the storage node contact plug and the hard mask or by wet etch process.

In accordance with an embodiment of the present invention, after etching the lower structure of the peripheral circuit region, a method for forming a semiconductor device further includes performing an oxidation process with respect to the peripheral circuit region.

In accordance with an embodiment of the present invention, after etching the lower structure of the peripheral circuit region, a method for forming a semiconductor device further includes forming a spacer nitride layer at an upper entire part; forming a spacer oxide layer on the spacer nitride layer; and performing a blanket etch to expose the semiconductor substrate of the peripheral circuit region.

In accordance with an embodiment of the present invention, after performing the blanket etch, a method for forming a semiconductor device further includes implanting ions into the semiconductor substrate of the peripheral circuit region.

In accordance with an embodiment of the present invention, after implanting the ions, a method for forming a semiconductor device further includes forming an etch stopping layer over the cell region and the peripheral circuit region.

In a method for forming a semiconductor device with a buried gate according to the present invention, a gate current of a peripheral circuit region may be increased and a leakage current be decreased because BPSG is not used at the peripheral circuit region as an interlayer dielectric layer. After the formation of a storage electrode contact, a gate is patterned to make a thickness of a hard mask layer of a gate of the peripheral circuit region thin, thereby providing a profitable effect in a formation of lightly doped drain (LDD) junction.

DESCRIPTION OF EMBODIMENTS

Embodiments of the present invention are described with reference to the accompanying drawings in detail.

Figure 1A:
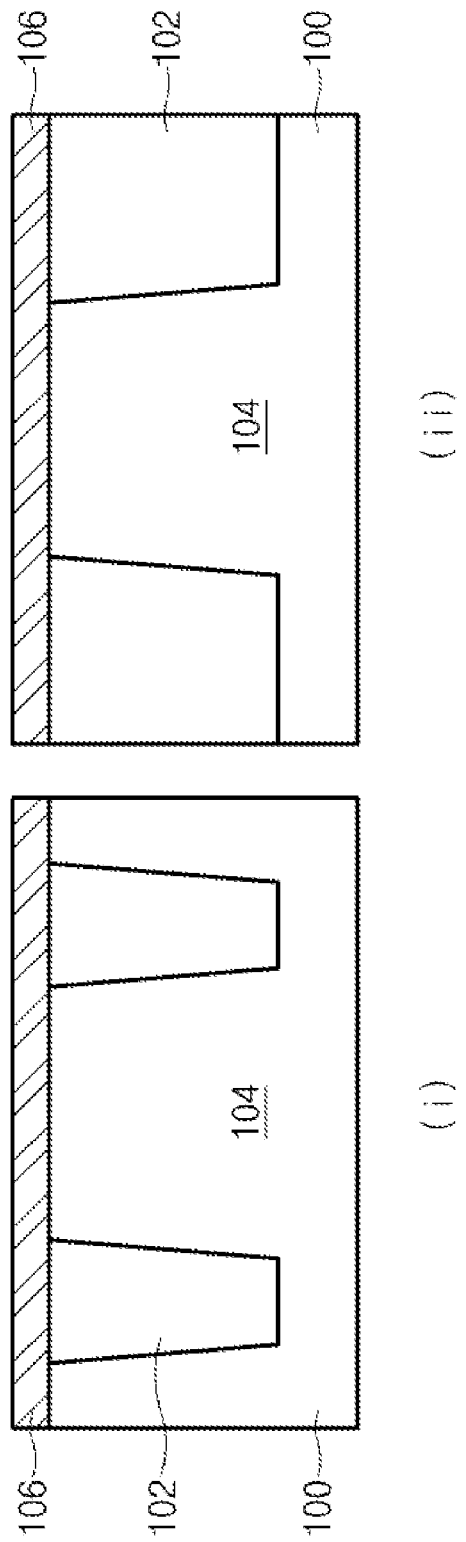
FIGS. 1*a* to FIG. 1*q* are cross-sectional views illustrating a method for forming a semiconductor device according to a first embodiment of the present invention wherein (i) indicates a cell region and (ii) indicates a peripheral circuit region.
Figure 1C:
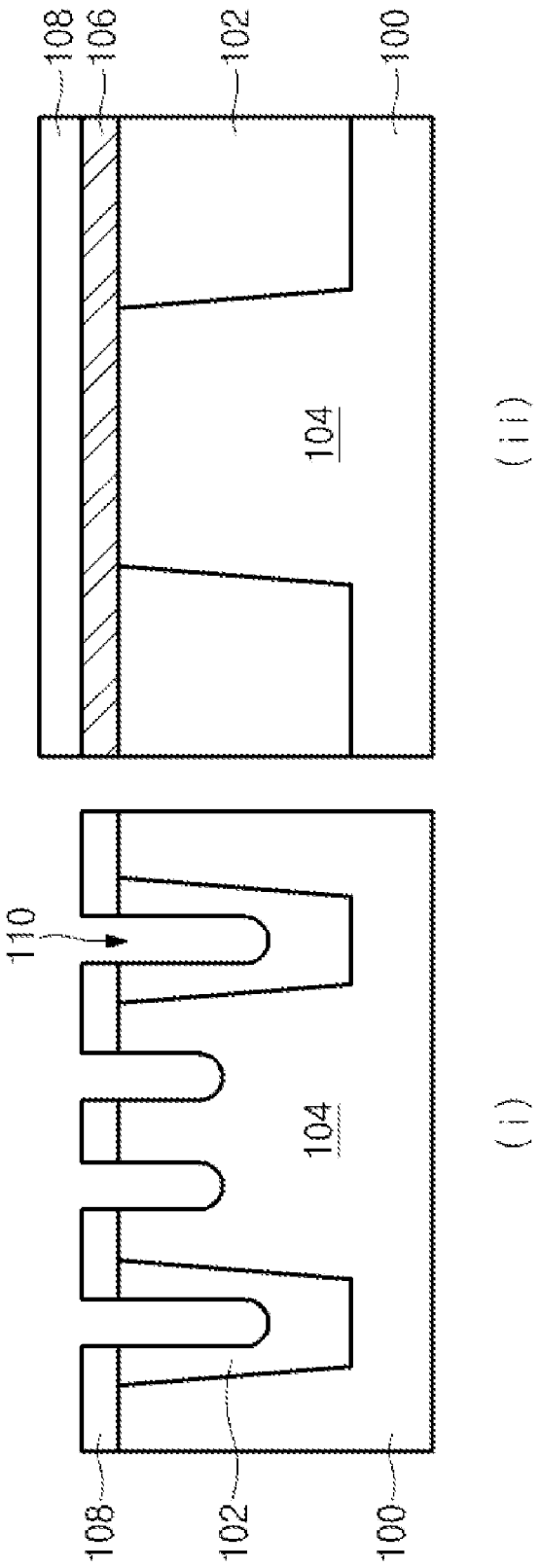
Figure 1E:
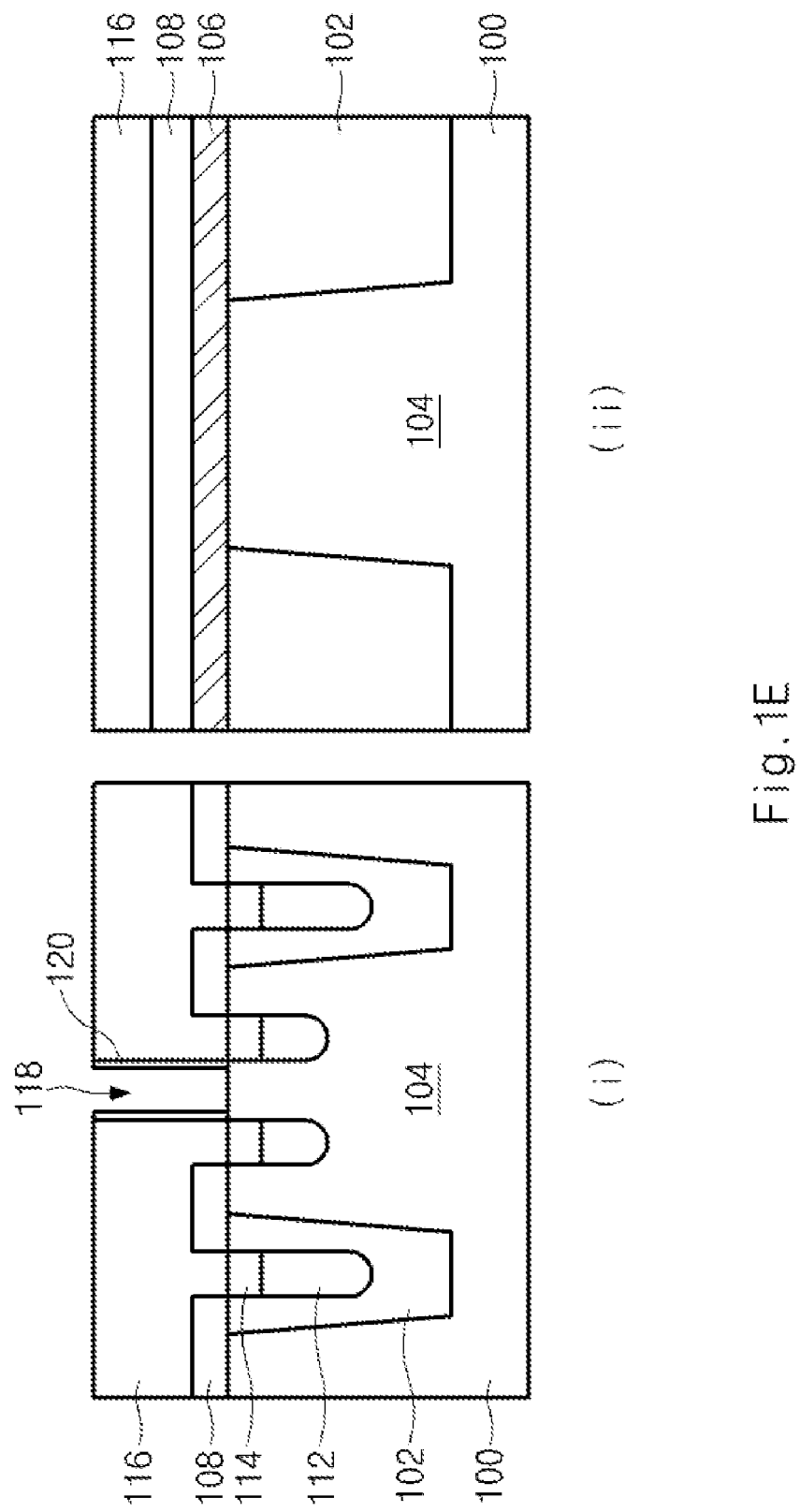
Figure 1F:
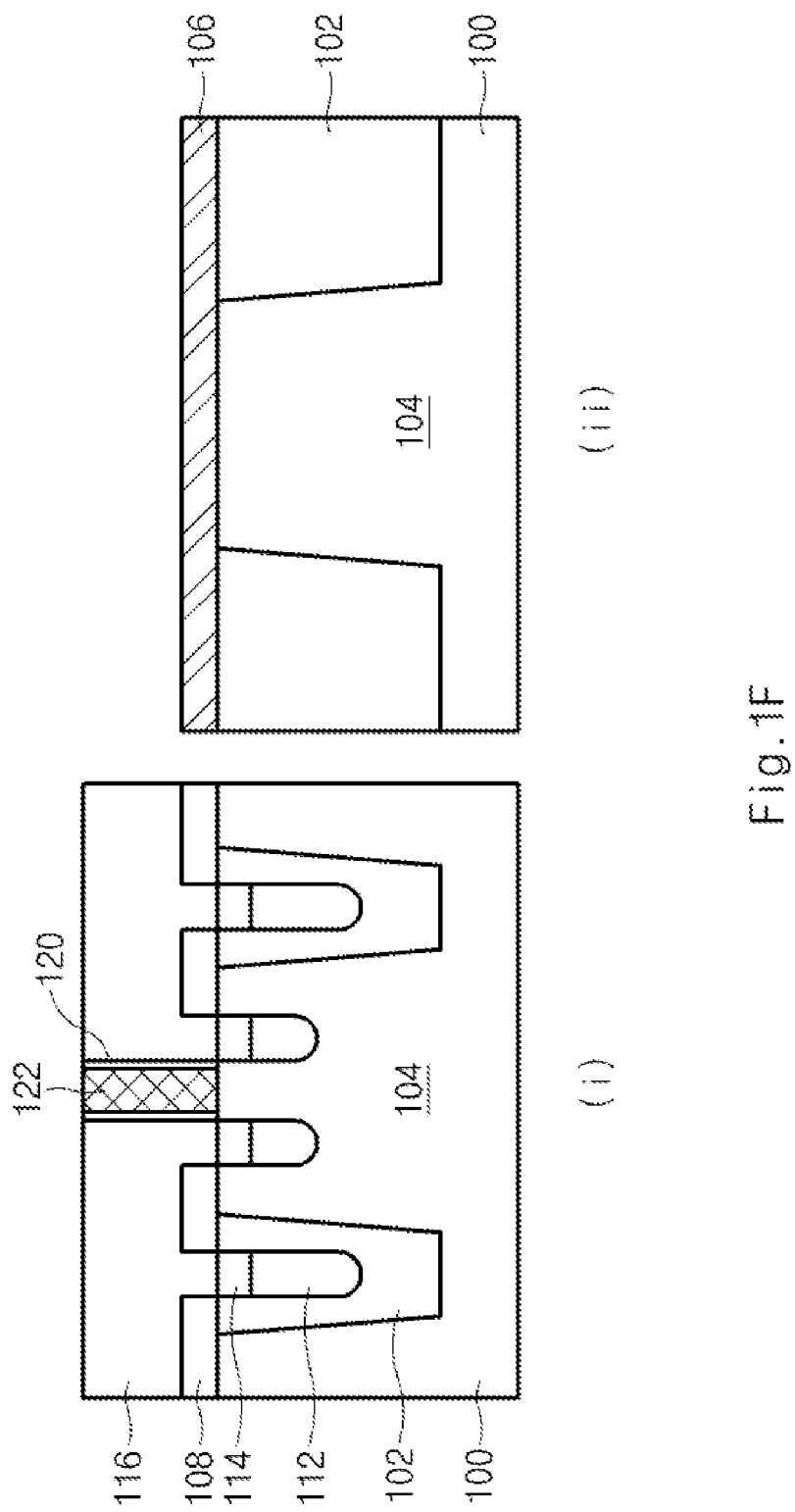
Figure 1G:
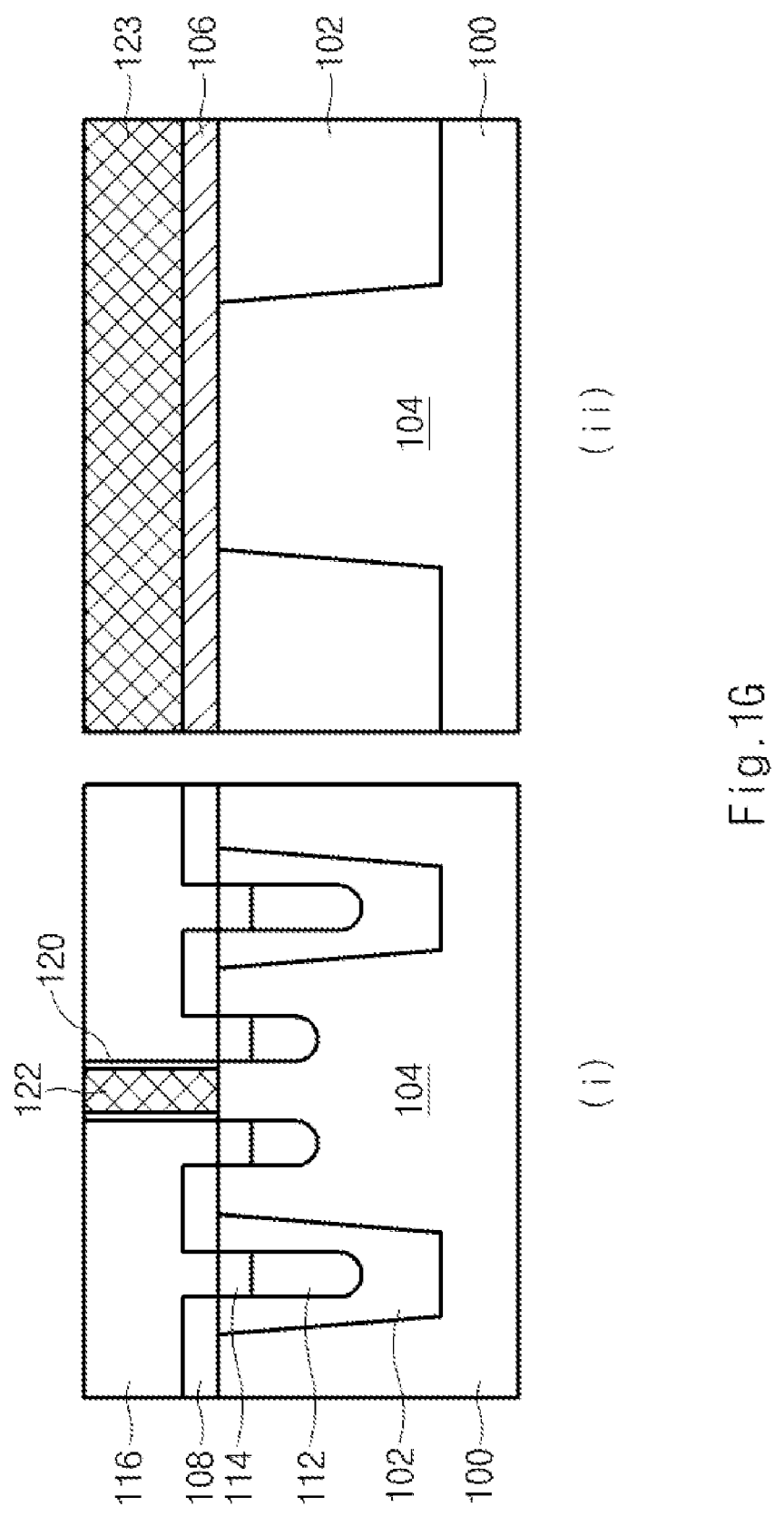
Figure 1H:
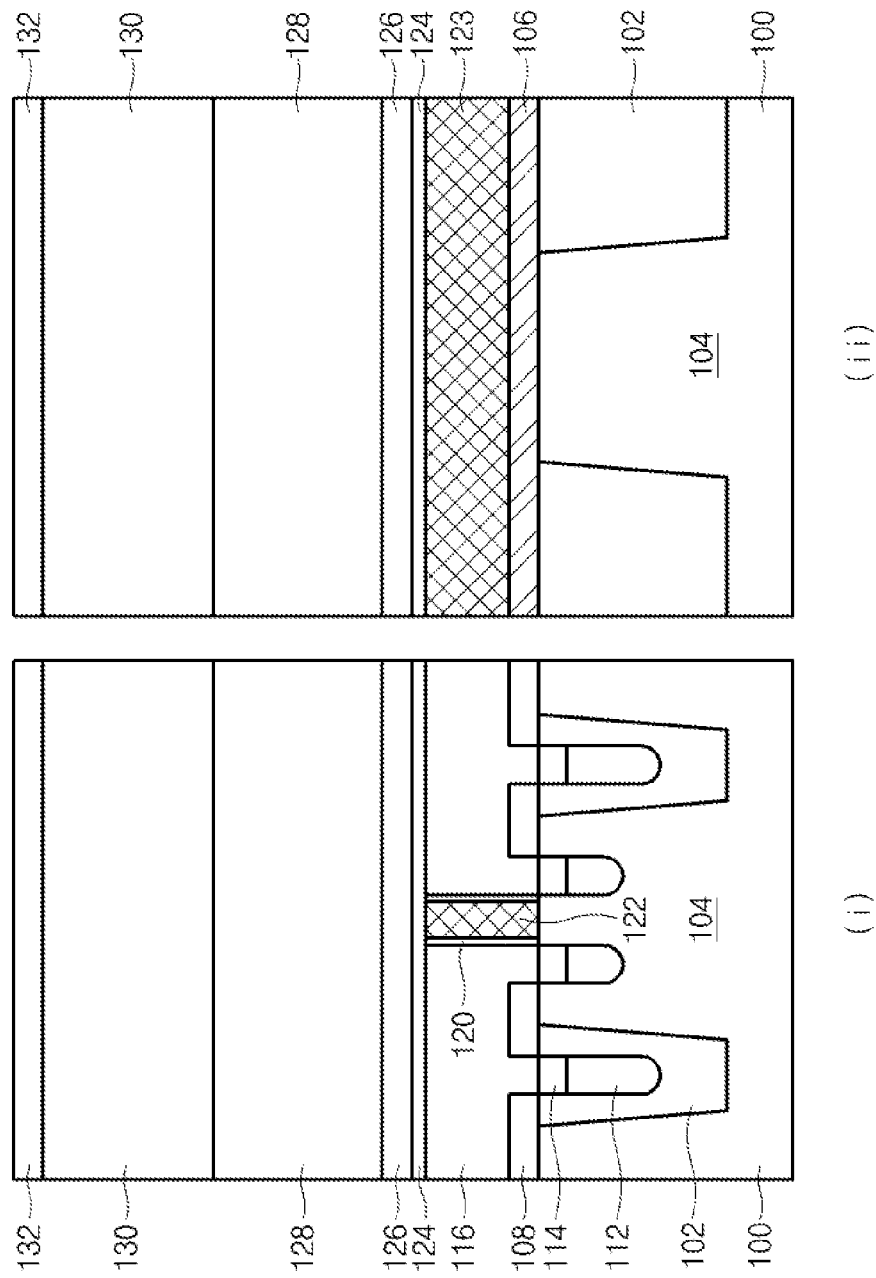
Figure 11:
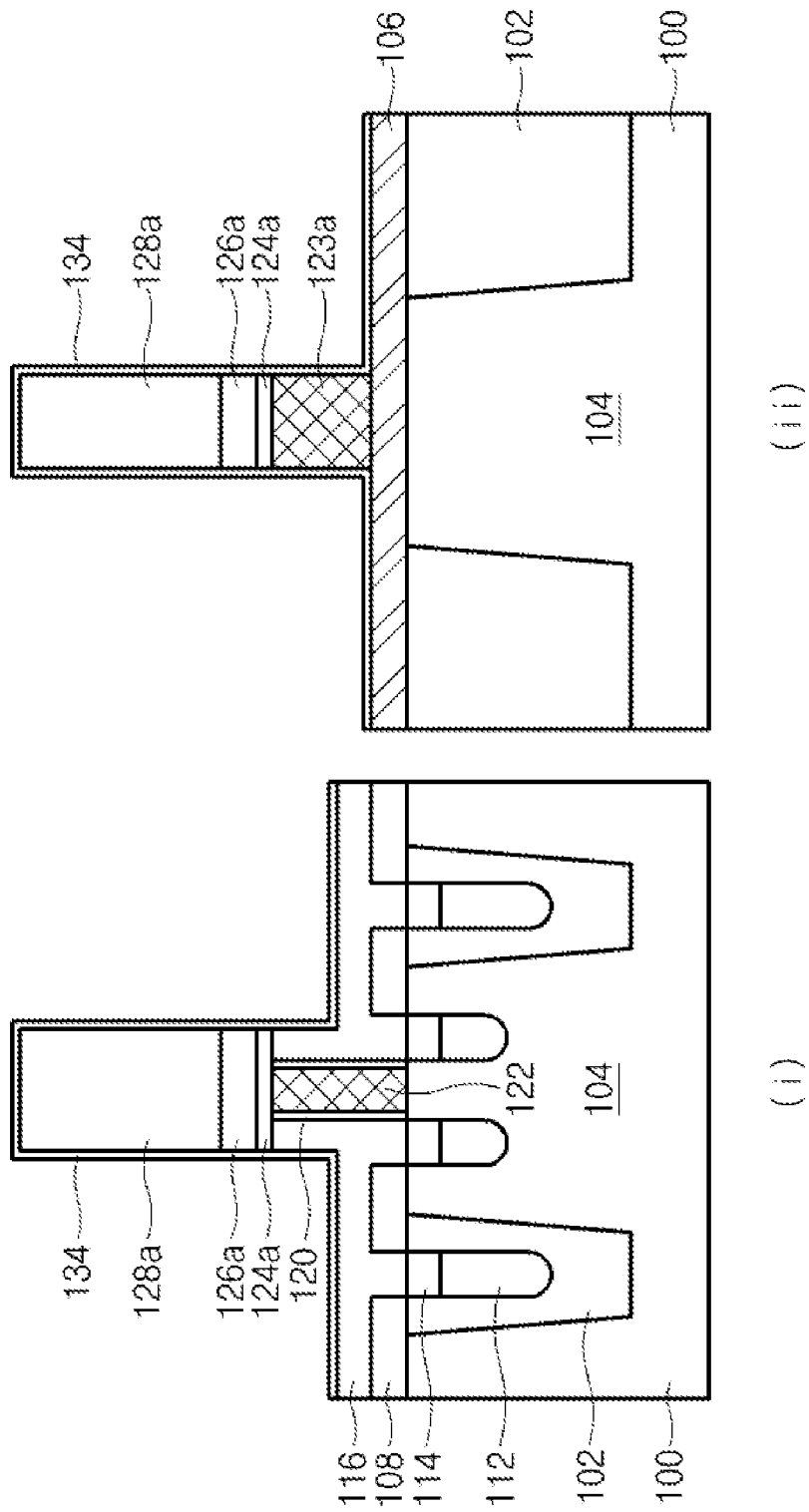
Figure 1J:
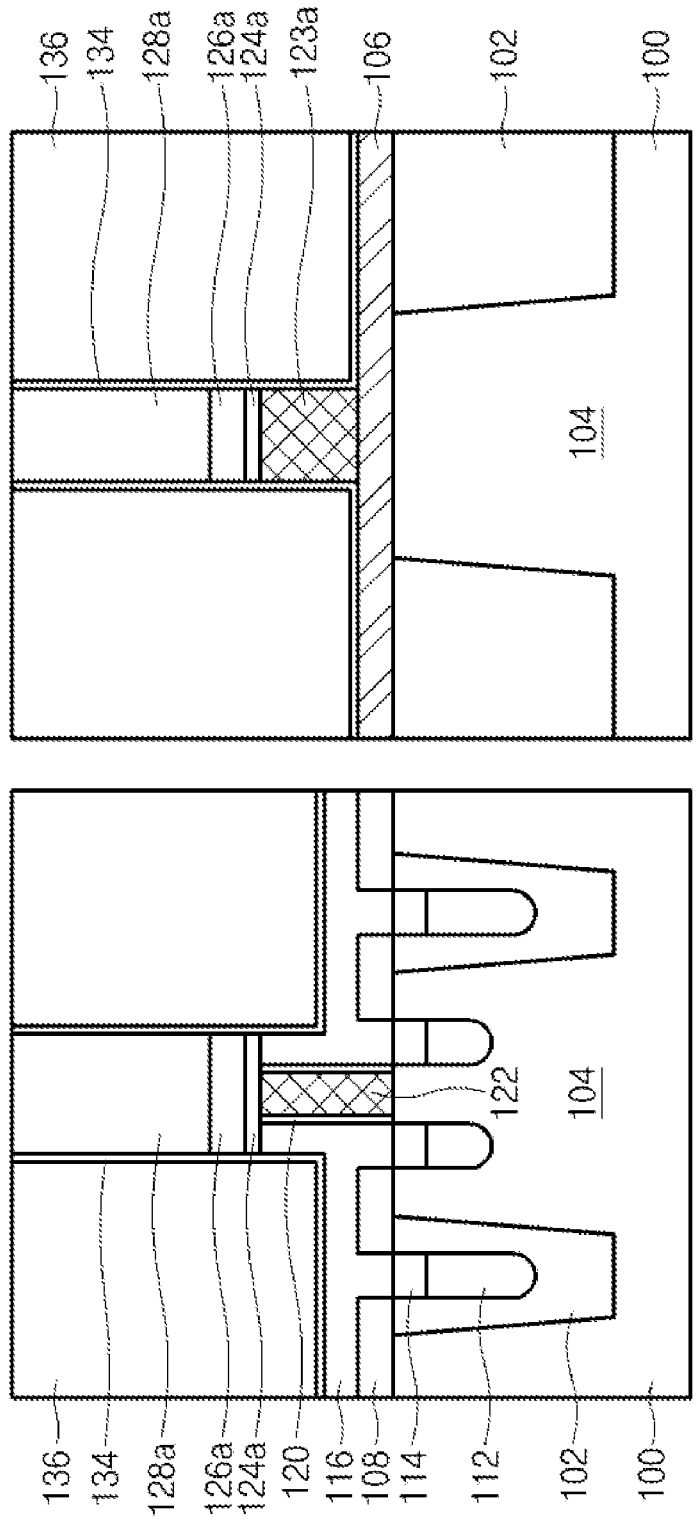
Figure 1K:
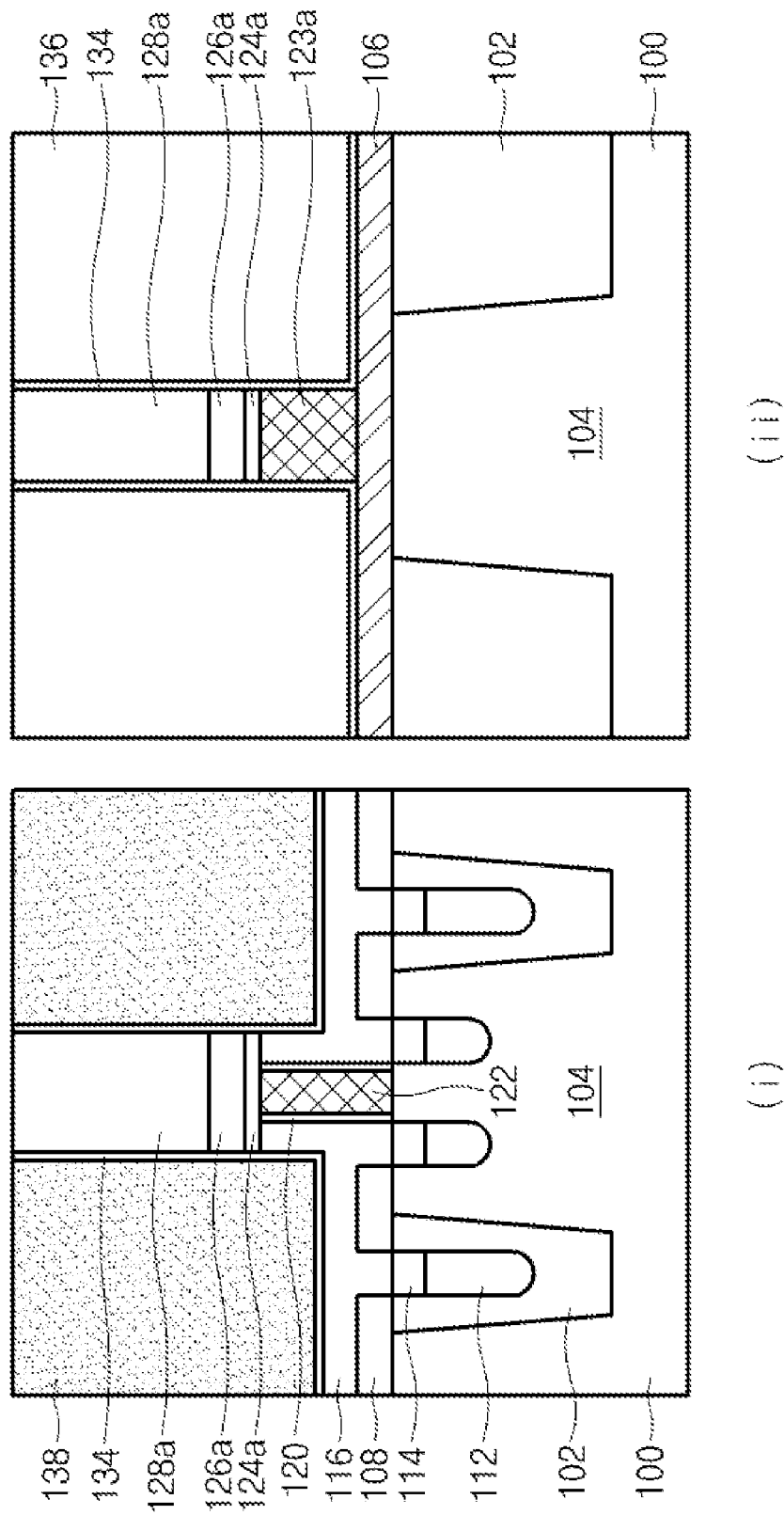
Figure 1L:
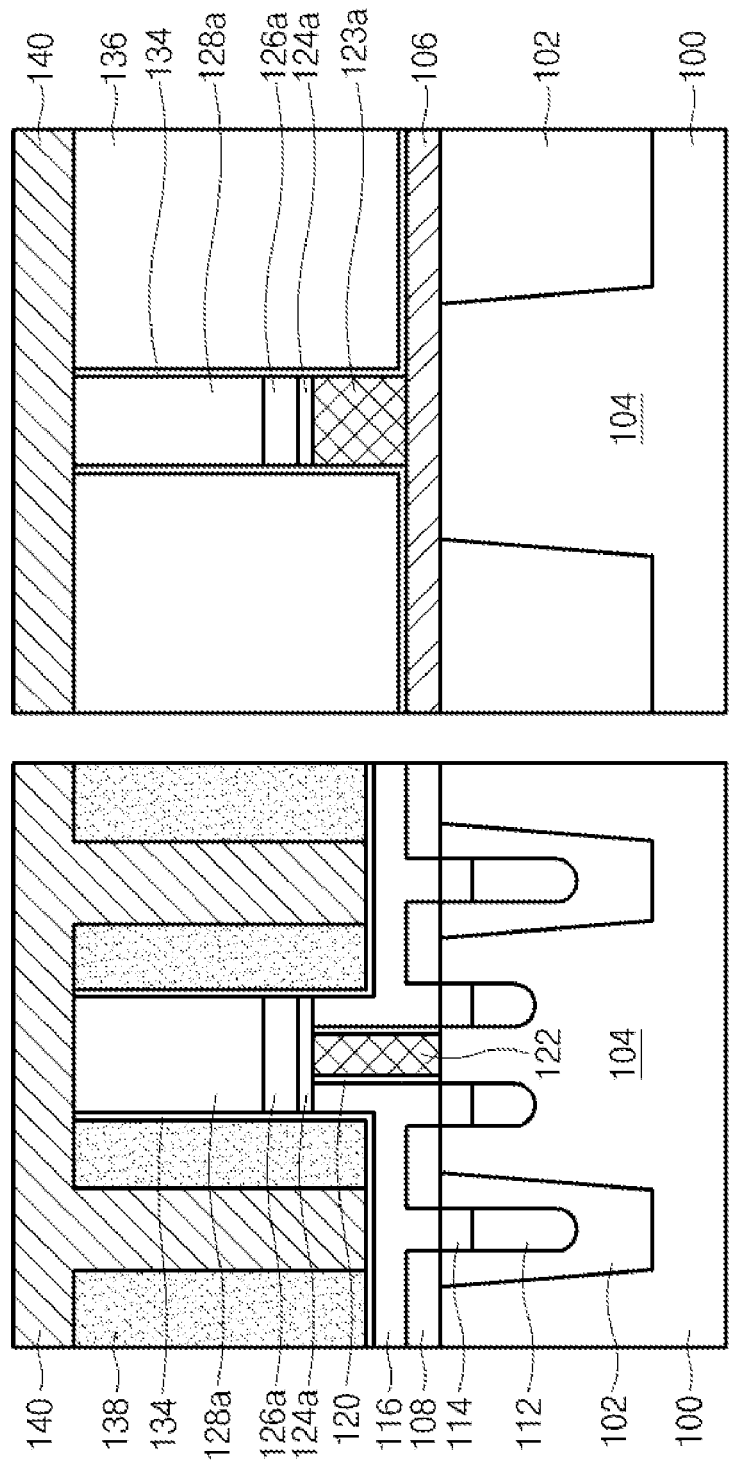
Figure 1M:
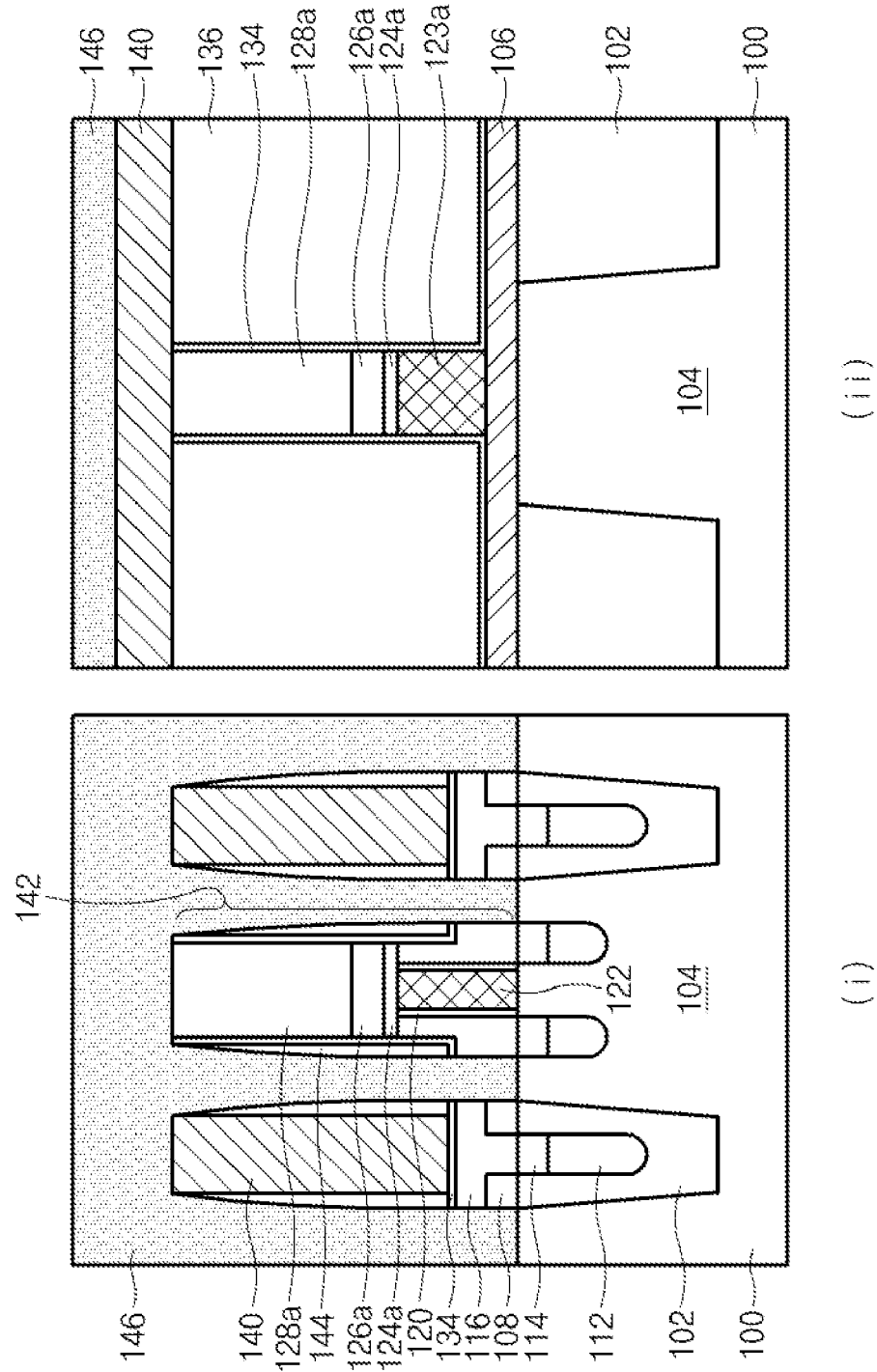
Figure 1N:
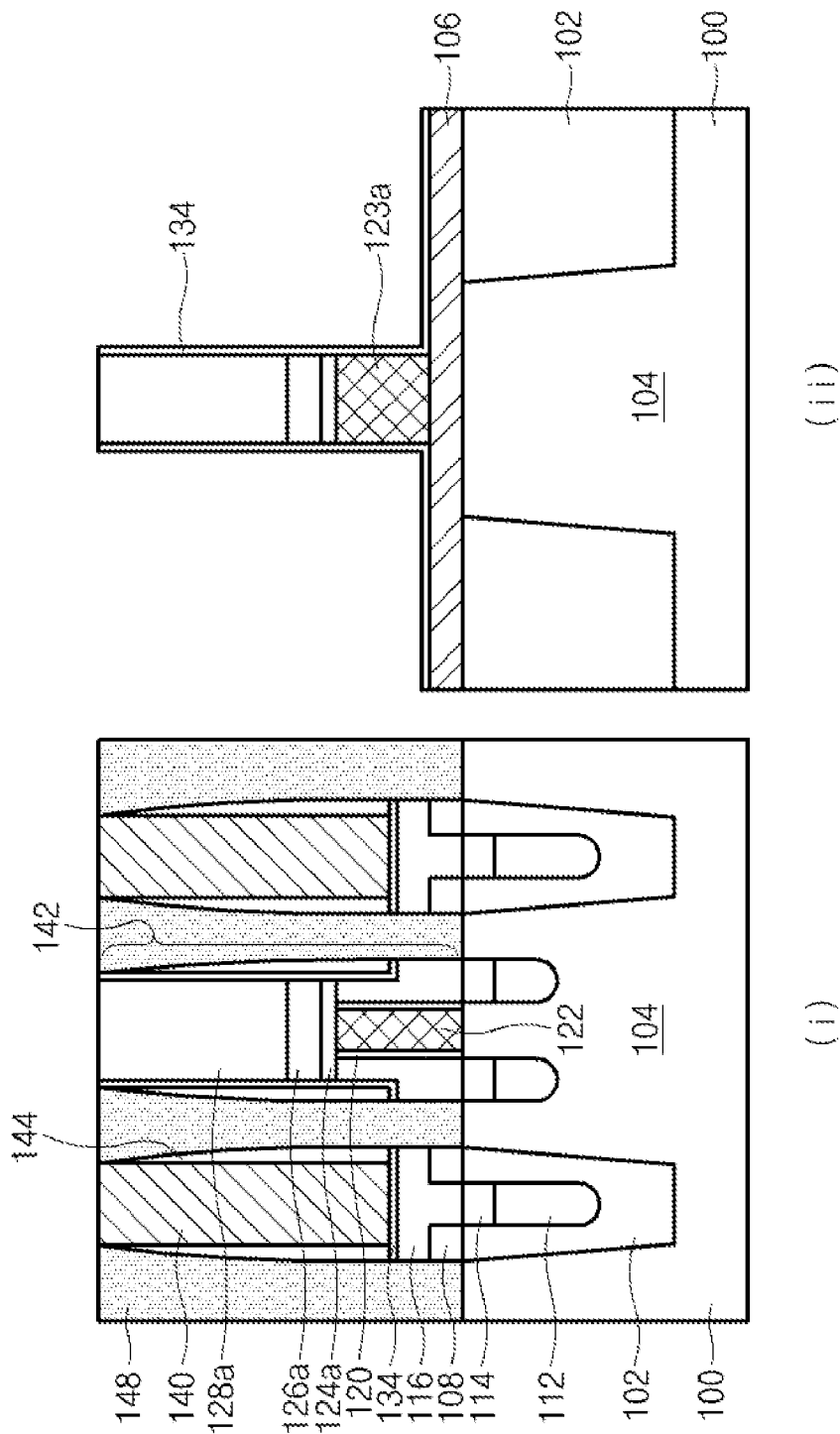
Figure 10:
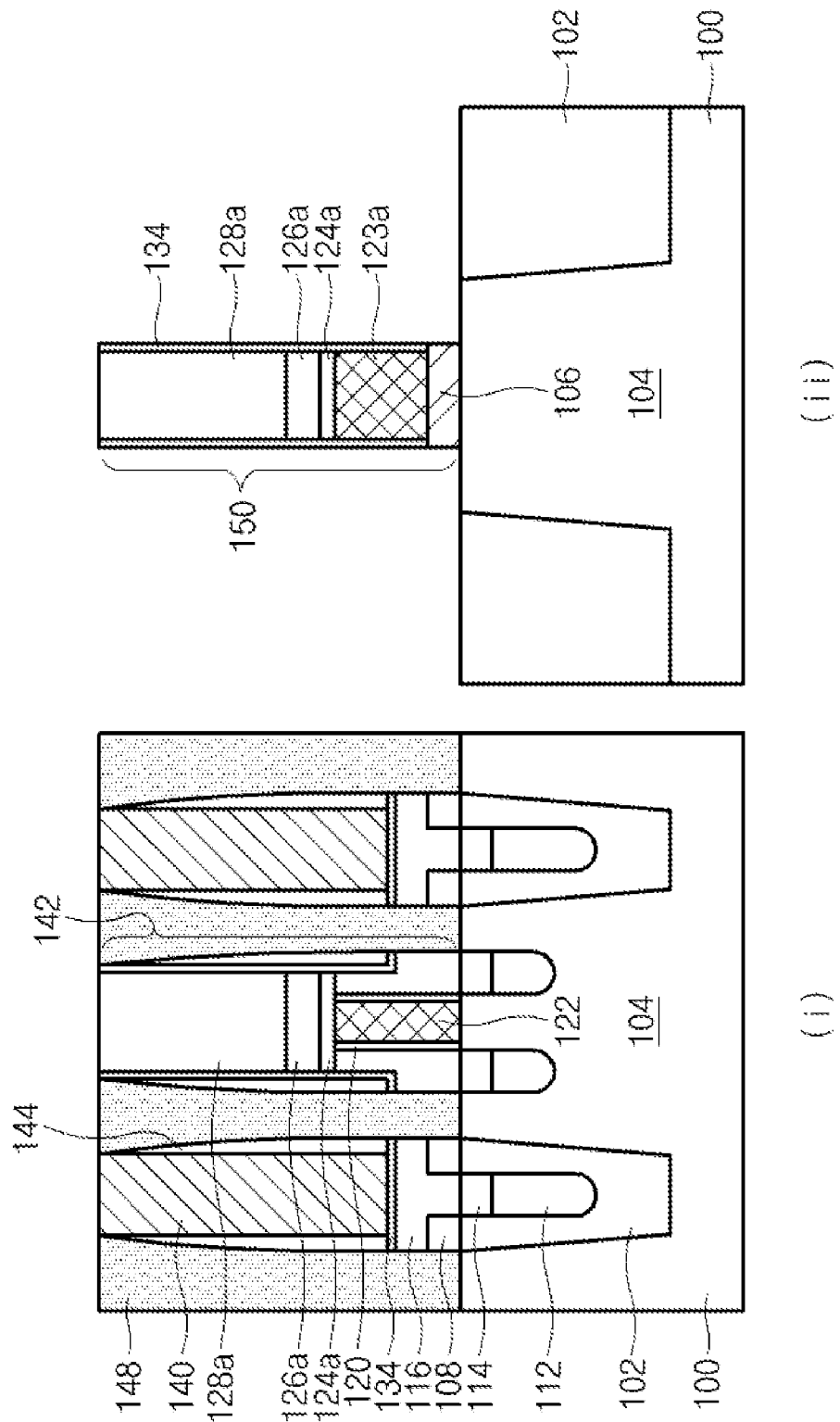
Figure 1P:
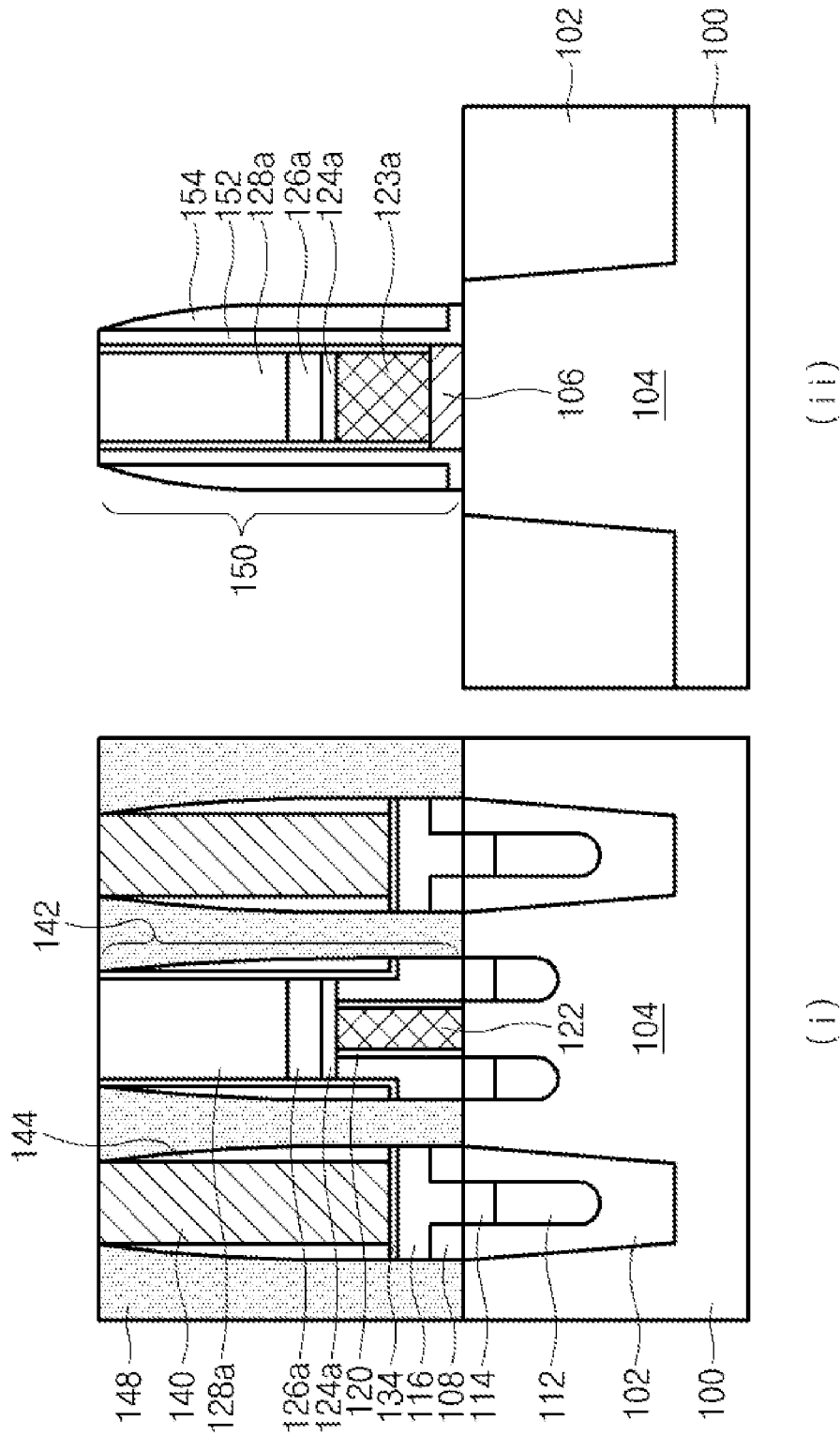
Figure 1Q:
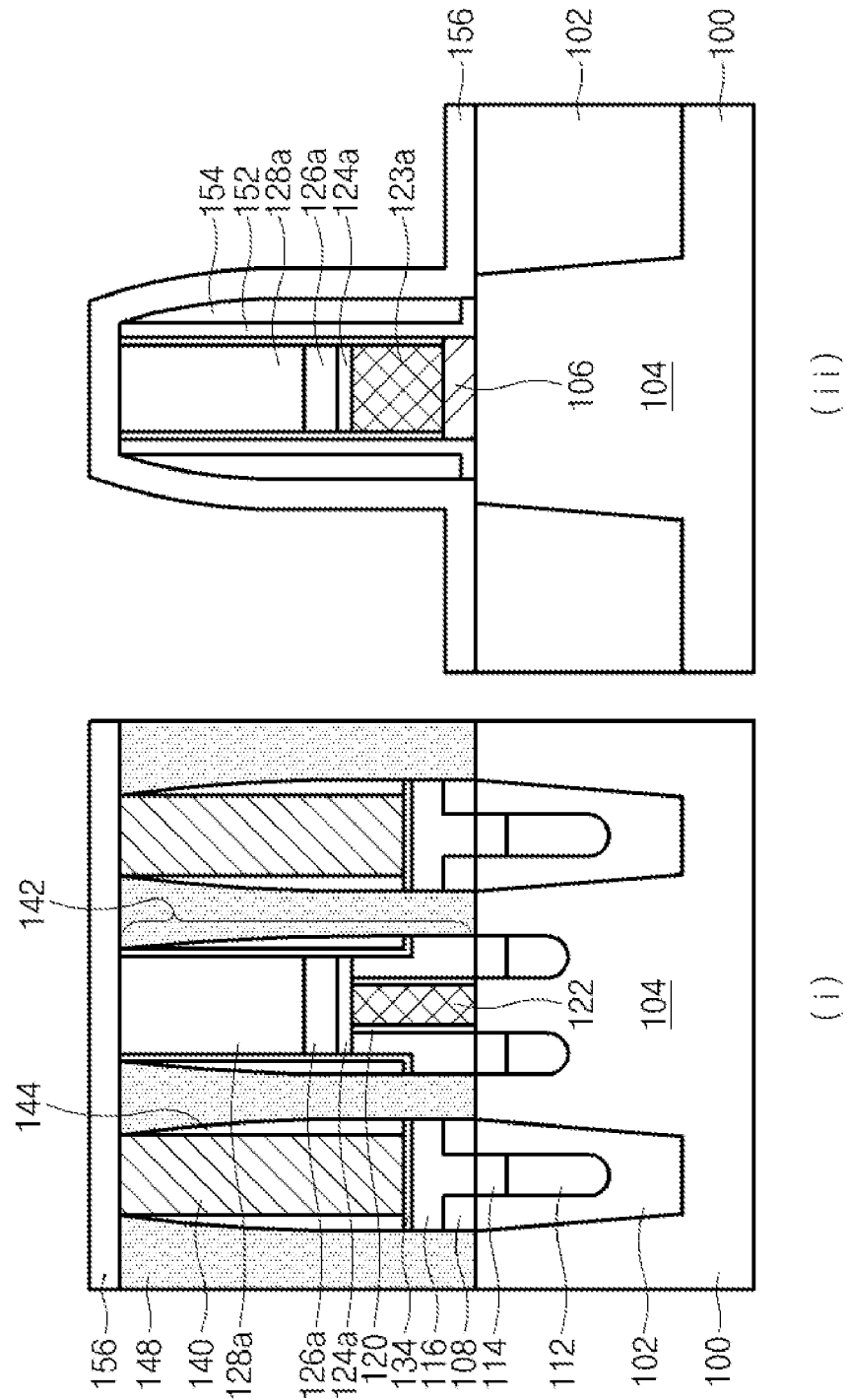

FIGS. 1A to FIG. 1Q are cross-sectional views illustrating a method for forming a semiconductor device according to a first embodiment of the present invention. In FIGS. 1A to FIG. 1Q, an (i) shows a cell region and an (ii) shows a peripheral circuit region.

Referring to FIG. 1A and FIG. 1B, a gate poly-silicon 106 is formed on a semiconductor substrate 100 including an active region 104 and a device isolation region 102 (FIG. 1A). Before the formation of the poly-silicon 106, a gate oxide layer (not shown) may be further formed. In this case, the poly-silicon 106 and a poly silicon 122 (FIG. 1G) formed on the gate poly silicon 106 at a subsequent step form a part of a gate electrode formed in a peripheral circuit region (ii).

After a photo resist pattern (not shown) is formed at an upper part of the peripheral circuit region using a cell open mask, the gate poly-silicon 106 of the cell region (i) is removed by using the photo resist pattern as an etch mask (FIG. 1B).

Referring to FIG. 1C, after a hard mask layer 108 defining a buried gate is formed at an entire surface, a photo resist pattern (not shown) defining a buried gate is formed on the hard mask layer 108. A hard mask layer 108 and the semiconductor substrate 100 are etched by using the photo resist pattern (not shown) as an etch mask to form a trench 110 for the buried gate. The trench 110 for the buried gate is preferably formed in the cell region (i) only.

Referring to FIG. 1D, a gate electrode layer 112 and a insulating layer 114 are formed to bury the trench 110 for the buried gate. Here, although not shown, an oxide layer and barrier metal may be further formed on the trench 110. Meanwhile, the gate electrode layer 112 is preferably formed of W, TiN, Ti or Ta.

Referring to FIG. 1E, an interlayer insulating layer 116 is formed over the cell region(i) and the peripheral circuit region (ii) on an entire upper surface. The interlayer insulating layer 116 is etched using a mask for a bit line contact plug exposing the active region 104 to form a bit line contact hole 118. An insulating layer is coated on the bit line contact hole 118. An etch-back is performed to form a spacer 120 at a sidewall of the bit line contact hole 118.

Referring to FIG. 1F, a conductive layer is formed to fill the bit line contact hole 118 (FIG. 1E), and then a planarizing process is performed until the interlayer insulating layer 116 is exposed to form a bit line contact plug 122. A photo resist pattern (not shown) is formed at the cell region (i), the interlayer insulating layer 116 of the peripheral circuit region (ii) is removed by using the photo resist pattern as an etch mask. In this case, the interlayer insulating layer 116 of the peripheral circuit region (ii) is preferably removed by a dry etch process. The hard mask layer 108 is preferably removed.

Referring to FIG. 1G, a poly-silicon 123 is formed at an entire surface, a photo resist pattern (not shown) is formed on the poly-silicon 123 of the peripheral circuit region (ii). Next, the poly-silicon 123 formed at the cell region (i) is removed using the photo resist pattern as an etch mask. A planarization etch process is performed to expose the interlayer insulating layer 116 of the cell region (i) and thus remove a step difference between the cell region (i) and the peripheral circuit region (ii).

Referring to FIG. 1H and FIG. 1I, a barrier metal 124, a conductive layer 126, hard mask layers 128 and 130, and an anti-reflecting layer 132 are sequentially formed at an entire surface (FIG. 1H). Then, a photo resist pattern (not shown) is formed on the anti-reflecting layer 132, and then the underlying layers in the cell region (i) are etched until the interlayer insulating layer 116 of the cell region (i) is exposed by using the photo resist pattern as an etch mask. A capping insulating layer 134 is formed at an entire surface (FIG. 1I). The capping insulating layer 134 preferably is a nitride layer. Then, the hard mask layer 130, the anti-reflecting layer 132 and the photo resist pattern (not shown) are removed.

At this step, the cell region (i) and the peripheral circuit region (ii) are simultaneously patterned by using the photo resist pattern formed on the anti-reflecting layer 132 as an etch mask. The bit line of the cell region and a gate of the peripheral circuit region are sequentially formed in each separate process, can prevent defects generated by the influence equally applied to the bit line and the gate.

Referring to FIG. 1J and FIG. 1K, a sacrificial insulating layer 136 is formed on an entire upper part (FIG. 1J). Here, the sacrificial insulating layer 136 preferably is an oxide layer formed at a low temperature, for example, a high density plasma (HDP) layer or a plasma enhanced tetra ethyl ortho silicate (PETEOS) layer. In this case, the sacrificial insulating layer 136 is preferably formed at 300° C. to 500° C. Next, a photo resist pattern is formed on the peripheral circuit region (ii) using a cell open mask, and then a sacrificial insulating layer 136 of the cell region (i) is removed by using the photo resist pattern as an etch mask.

An interlayer dielectric layer 138 is formed on the cell region (i) (FIG. 1K). In this case, the interlayer dielectric layer 138 is preferably formed of BPSG. Here, because the sacrificial insulating layer 136 is formed on the peripheral circuit region (ii), the interlayer dielectric layer 138 formed on the cell region (i) the interlayer dielectric layer 138 does not form the peripheral region (ii). Accordingly, conventional problems due to implanting boron ions into the peripheral circuit region (ii) can be prevented. And sacrificial insulating layer 136 is formed at a low temperature, negative effects by the sacrificial insulating layer 136 can be minimized, and thus operational characteristics of the gate in the peripheral circuit region (ii), including the leakage current characteristics can be significantly improved.

Referring to FIG. 1L, a photo resist pattern (not shown) is formed on the interlayer dielectric layer 138 of the cell region (i) using an exposure mask defining a device isolation region. The interlayer dielectric layer 138 is etched exposing the capping insulating layer 134 formed in the peripheral region (ii) by using the photo resist pattern as an etch mask. Next, an isolation insulating layer is formed at the cell region and the peripheral circuit region. The isolation insulating layer preferably is a nitride layer.

Referring to FIG. 1M, a photo resist pattern is formed at the peripheral circuit region (ii), and the isolation insulating layer 140 and the interlayer dielectric layer 138 is removed by using the photo resist pattern as an etch mask. At this time, the isolation insulating layer is preferable removed by a dry etch process. Meanwhile, the interlayer dielectric layer 138 thereof is preferably removed by a wet etch process.

Then, an insulting layer is formed at the cell region (i) and an etch-back is performed to form a spacer 144 at a sidewall of an isolation insulating layer 140 in the isolation region 102 of the cell region (i) and the spacer 144 in the cell region is formed at a sidewall of the hard mask pattern 128a, the conductive layer pattern 126a, the barrier metal pattern 124a, and the insulating layer 116. Next, the insulating layer 116 and the hard mask layer 108 are etched to expose the semiconductor substrate 100 by using the spacer 144 as an etch mask, thereby forming a complete bit line 142. Subsequently, a conductive layer 146 is formed at an entire surface. At this time, the conductive layer 146 for the storage electrode contact plug is formed to be electrically connected with the active region 104 of the cell region (i).

Referring to FIG. 1N, a planarization etch process on the conductive layer 146 is performed to expose the hard mask layer pattern 128a to form a storage electrode contact plug 148. In this procedure, it is preferred that the isolation insulating layer 140 remaining on the sacrificial insulating layer 136 in the peripheral circuit region (ii) is also removed by the planarization etch process. Then, the sacrificial insulating layer 136 is removed to expose the capping insulating layer 134 disposed on the peripheral circuit region (ii). In this case, since the sacrificial insulating layer 136 has a different etch selectivity with respect to the storage electrode contact plug 148 and the hard mask layer pattern 128a remaining on the upper most part of the cell region (i), it may be removed without an additional mask process. For example, the sacrificial insulating layer 136 in the peripheral circuit region (ii) is preferably removed by a wet etch.

Referring to FIG. 1O, the poly-silicon 106 is patterned to expose the semiconductor substrate 10 by using the capping insulating layer 134 of the peripheral circuit region (i), thereby forming the gate 150 in the peripheral circuit region (ii). At this time, a gate poly-silicon 106 at a lower part of the gate 150 is exposed, a selective oxidizing process with respect to the lower part of the gate 150 is preferably performed to oxio the gate poly-silicon 106 and the semiconductor substrate 100. As illustrated previously, the selective oxidie process performed at the lower part of the gate 150 may improve the Gate Induced Drain Leakage (GIDL) characteristics of the gate 150.

Referring to FIG. 1P, a nitride layer spacer material and an oxide layer spacer material are deposited on an entire upper surface, a blank etch is executed to form gate spacers 152 and 154 at sidewalls of the gate 150, respectively. Subsequently, ions are preferably implanted into the semiconductor substrate 100 to form source/drain regions (not shown) by using the gate spacer 154 as a mask. According to the present invention, the gate 150 in the peripheral circuit region (ii) the bit line 142 in the cell region (i) are formed at a separate process step, negative effects onto each other can be prevented. For example, in order to enhance the operation characteristics of the gate 150, ions can be implanted by easily adjusting an ion implantation angle during a lightly doped drain (LDD) implantation process.

Referring to FIG. 1Q, an etch stopping layer 156 is formed at an entire upper part. In this case, the etch stopping layer 156 preferably is a nitride layer. Here, it is preferred that the etch stopping layer 156 serves as an etch stopping layer for a subsequent procedure in the peripheral circuit region (ii). At this time, because the etch stopping layer 156 is formed after the storage electrode contact plug is formed in the cell region (i), it may be formed with a sufficient thickness. In a conventional art, an etch stopping layer is formed before a storage electrode contact plug is formed. Accordingly, a formation region of the storage electrode contact plug is partially buried to form the etch stopping layer with an insufficient thickness. However, in the present invention, because the etch stopping layer is formed after forming the storage electrode contact plug, it can be formed with a sufficient thickness.

As is clear from the forgoing description, in the method for forming a semiconductor device according to the present invention, after a first etch is performed to partially define a bit line and a gate of a peripheral circuit region at a cell region, and a storage electrode contact plug of the cell region is formed, the gate of the peripheral circuit region is manufactured through a second etch. Accordingly, the bit line and the gate of the cell region and the peripheral circuit region are simultaneously formed to solve a problem occurring due to execution of the same process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming semiconductor device, comprising:
   forming a lower structure on a semiconductor substrate;
   etching a hard mask layer and a conductive layer formed on the semiconductor substrate;
   forming a sacrificial insulating layer over the etched hard mask layer and the etched conductive layer of a peripheral circuit region;
   forming an isolation insulating layer on a device region of a cell region;
   forming spacers at sidewalls of the etched hard mask layer, the etched conductive layer, and the isolation insulating layer of the cell region, respectively;
   forming storage electrode contact plugs at both sides of each of the spacers, respectively; and
   etching the lower structure to expose the semiconductor substrate of the peripheral circuit region to form a gate.

2. The method of claim 1, further comprising:
   before etching the hard mask layer and the conductive layer, forming a buried gate in the semiconductor substrate of the cell region.

3. The method of claim 1, wherein the lower structure includes:
   a bit line contact plug formed under the conductive layer of the cell region; and
   a poly-silicon layer formed at the peripheral circuit region.

4. The method of claim 1, further comprising:
   after etching the hard mask layer and the conductive layer, coating a capping insulating layer on of the etched hard mask layer and the etched conductive layer.

5. The method of claim 4, wherein the step of etching the lower structure of the peripheral circuit region comprises:
   etching the lower structure by using the capping insulating layer formed on the etched hard mask layer and the etched conductive layer of the peripheral circuit region.

6. The method of claim 1, wherein the step of forming the sacrificial insulating layer at the peripheral circuit region comprises:
   forming the sacrificial insulating layer at an upper entire part; and
   removing the sacrificial insulating layer of the cell region using a cell open mask.

7. The method of claim 1, wherein the sacrificial insulating layer includes a plasma enhanced tetra ethyl ortho silicate (PETEOS) layer or a high density plasma (HDP) layer.

8. The method of claim 1, wherein the step of forming the sacrificial insulating layer is formed at 300° C. to 500° C.

9. The method of claim 1, wherein the step of forming the isolation insulating layer on the device isolation region of the cell region comprises:
   forming an interlayer dielectric layer over an upper part of the cell region;
   removing the interlayer dielectric layer to expose of the device isolation region;
   forming the isolation insulating layer on the interlayer dielectric layer and a region in which the interlayer dielectric layer is removed;
   removing the isolation insulating layer formed on the interlayer dielectric layer; and
   removing the interlayer dielectric layer remaining at a side wall of the isolation insulating layer.

10. The method of claim 9, wherein the isolation insulating layer comprises a nitride layer.

11. The method of claim 9, wherein removing the isolation insulating layer is performed by a dry etch process.

12. The method of claim 9, wherein removing the interlayer dielectric layer is performed by a wet etch process.

13. The method of claim 1, after forming the spacers, further comprising etching the lower structure of the cell region to form a bit line by using the spacers as an etch mask.

14. The method of claim 1, wherein the step of forming storage electrode contact plugs at both sides of each of the spacers, respectively comprises:
   forming a conductive layer for a storage electrode contact plug over the cell region and the peripheral circuit region;
   performing a planarization etch process to expose the upper part of the etched hard mask layer of the cell region and the isolation insulating layer of the peripheral circuit region; and
   removing the sacrificial insulating layer of the peripheral circuit region.

15. The method of claim 14, wherein removing the sacrificial insulating layer of the peripheral circuit region is performed by using a different etching selectivity of the storage electrode contact plug and the hard mask.

16. The method of claim 14, wherein removing the sacrificial insulating layer of the peripheral circuit region is performed by wet etch process.

17. The method of claim 1, further comprising:
   after etching the lower structure of the peripheral circuit region, performing an oxidizing process with respect to the peripheral circuit region.

18. The method of claim 1, wherein after etching the lower structure of the peripheral circuit region, the method further comprises:
   forming a spacer nitride layer at an upper part;
   forming a spacer oxide layer on the spacer nitride layer; and
   performing a blanket etch to expose the semiconductor substrate of the peripheral circuit region.

19. The method of claim 18, further comprising:
   after performing the blanket etch, implanting ions into the semiconductor substrate of the peripheral circuit region.

20. The method of claim 19, further comprising:
   after implanting the ions, forming an etch stopping layer over the cell and the peripheral circuit region,
   wherein the etch stop layer is formed after the storage electrode contact plug is formed.

* * * * *